(12) United States Patent
Oh

(10) Patent No.: US 12,164,328 B2
(45) Date of Patent: Dec. 10, 2024

(54) DISPLAY DEVICE

(71) Applicant: Samsung Display Co., Ltd., Yongin-si (KR)

(72) Inventor: Young Eun Oh, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 210 days.

(21) Appl. No.: 17/727,092

(22) Filed: Apr. 22, 2022

(65) Prior Publication Data

US 2022/0392816 A1    Dec. 8, 2022

(30) Foreign Application Priority Data

Jun. 7, 2021  (KR) .......................... 10-2021-0073731

(51) Int. Cl.
*G06F 1/16*    (2006.01)

(52) U.S. Cl.
CPC .................................. *G06F 1/1616* (2013.01)

(58) Field of Classification Search
CPC ............................ G06F 1/1616; G06F 1/1652
See application file for complete search history.

(56) References Cited

U.S. PATENT DOCUMENTS

| | | | | |
|---|---|---|---|---|
| 2018/0146560 | A1* | 5/2018 | Chen | ..................... G06F 1/1626 |
| 2019/0204867 | A1* | 7/2019 | Song | ..................... G06F 1/1641 |
| 2020/0089277 | A1 | 3/2020 | Park et al. | |
| 2021/0027670 | A1* | 1/2021 | Chou | ..................... G09F 9/301 |
| 2021/0174711 | A1* | 6/2021 | Cho | ..................... H10K 59/40 |

FOREIGN PATENT DOCUMENTS

| | | |
|---|---|---|
| KR | 10-2019-0062107 | 6/2019 |
| KR | 10-2020-0032793 | 3/2020 |
| KR | 10-2020-0099054 | 8/2020 |
| KR | 10-2020-0108754 | 9/2020 |

* cited by examiner

*Primary Examiner* — James Wu
*Assistant Examiner* — Dakota M Talbert
(74) *Attorney, Agent, or Firm* — KILE PARK REED & HOUTTEMAN PLLC

(57) ABSTRACT

A display device includes a display panel, a support member disposed below the display panel, and a cushion layer disposed below the support member and including a first cushion part overlapping a first non-folding region, and a second cushion part overlapping a second non-folding region, the support member including an upper plate, and a lower plate below the upper plate. The lower plate includes a first lower plate including a first horizontal part parallel to a plane defined by a first direction and a second direction intersecting the first direction, and a first vertical part extended from the first horizontal part and bent toward the first cushion part, and a second lower plate spaced apart from the first lower plate, and including a second horizontal part parallel to the plane, and a second vertical part extended from the second horizontal part and bent toward the second cushion part.

21 Claims, 10 Drawing Sheets

DISPLAY DEVICE

CROSS-REFERENCE TO RELATED APPLICATION(S)

This U.S. non-provisional patent application claims priority to and benefits of Korean Patent Application No. 10-2021-0073731 under 35 U.S.C. § 119, filed on Jun. 7, 2021 in the Korean Intellectual Property Office, the entire contents of which are hereby incorporated by reference.

BACKGROUND

1. Technical Field

The disclosure herein relates to a display device with improved folding properties and impact resistance properties.

2. Discussion of the Related Art

A display device includes an active region activated in accordance with an electrical signal. The display device may sense an input applied from the outside through the active region, and simultaneously display various images to provide information to a user. With the recent development of display devices having various shapes, active regions having various shapes are implemented.

Recently, flexible display devices including a flexible display panel which may be foldable are being developed. A flexible display device may be folded, rolled, and/or bent, unlike a rigid display device. A flexible display device whose shape may be variously changed may be even more portable regardless of the full screen size thereof, such that user convenience may be improved.

SUMMARY

The disclosure provides a display device with improved folding properties and impact resistance properties.

An embodiment provides a display device that may include a first non-folding region, a folding region, and a second non-folding region which may be sequentially defined in a first direction, a display panel, a support member disposed below the display panel, and a cushion layer disposed below the support member and including a first cushion part overlapping the first non-folding region in a plan view, and a second cushion part overlapping the second non-folding region in a plan view, the support member including an upper plate, and a lower plate disposed below the upper plate, wherein the lower plate includes a first lower plate including a first horizontal part parallel to a plane defined by the first direction and a second direction intersecting the first direction, and a first vertical part extended from the first horizontal part and bent toward the first cushion part, and a second lower plate spaced apart from the first lower plate, and including a second horizontal part parallel to the plane, and a second vertical part extended from the second horizontal part and bent toward the second cushion part.

In an embodiment, the first vertical part may include a first round part bent with a first radius of curvature, the second vertical part may include a second round part bent with a second radius of curvature, and each of the first radius of curvature and the second radius of curvature may be about 1 mm or less.

In an embodiment, the first vertical part and the second vertical part may overlap the folding region in a plan view.

In an embodiment, the lower plate may include a copper alloy.

In an embodiment, openings may be formed in the upper plate.

In an embodiment, the upper plate may include a plate folding region corresponding to the folding region, and the openings may be formed in the plate folding region.

In an embodiment, the upper plate may include a first plate non-folding region, the plate folding region, and a second plate non-folding region which may be sequentially arranged in the first direction.

In an embodiment, the first vertical part and the second vertical part may each be extended in a third direction intersecting the first direction and the second direction.

In an embodiment, the first vertical part may be disposed more adjacent to the upper plate than a lower surface of the first cushion part, and the second vertical part may be disposed more adjacent to the upper plate than a lower surface of the second cushion part.

In an embodiment, the first vertical part may overlap at least a portion of the first cushion part in a cross-sectional view, and the second vertical part may overlap at least a portion of the second cushion part in a cross-sectional view.

In an embodiment, the first vertical part may contact at least a portion of a side surface of the first cushion part, and the second vertical part may contact at least a portion of a side surface of the second cushion part.

In an embodiment, the first vertical part may include a first inner surface adjacent to the first cushion part, a first outer surface spaced apart from the first cushion part, and a first connection surface extending between the first inner surface and the first outer surface, the second vertical part may include a second inner surface adjacent to the second cushion part, a second outer surface spaced apart from the second cushion part, and a second connection surface extending between the second inner surface and the second outer surface, and each of the first connection surface and the second connection surface may include an inclined surface parallel to the plane, or inclined at an angle with respect to the plane.

In an embodiment, the first connection surface may be positioned more adjacent to the upper plate than the lower surface of the first cushion part in case that the first cushion part is applied with a first pressure in a third direction crossing the first direction and the second direction, the second connection surface is positioned more adjacent to the upper plate than the lower surface of the first cushion part in case that the second cushion part is applied with the first pressure in the third direction, and the first pressure may be about 1 MPa or less.

In an embodiment, the support member may further include a cover film disposed between the upper plate and the lower plate.

In an embodiment, a display device may include a display panel including a first non-folding region, a folding region, and a second non-folding region which may be sequentially defined in a direction, and a support member disposed below the display panel, the support member including an upper plate including openings formed therein and overlapping the folding region in a plan view, and a lower plate disposed below the upper plate and including a first lower plate and a second lower plate spaced apart from the first lower plate, wherein the first lower plate includes a first horizontal part parallel to the display panel, and a first vertical part extended from the first horizontal part and bent in a second direction away from the display panel, and the second lower plate includes a second horizontal part parallel to the display panel, and a second vertical part extended from the second horizontal part and bent in the second direction away from the display panel, wherein the first vertical part and the second vertical part overlap the folding region in a plan view.

In an embodiment, the first vertical part may include a first round part bent with a first radius of curvature, the second vertical part may include a second round part bent with a second radius of curvature, and each of the first radius of curvature and the second radius of curvature may be about 1 mm or less.

In an embodiment, the lower plate may include a copper alloy.

In an embodiment, the upper plate may include a plate folding region overlapping the folding region in a plan view, and a first plate non-folding region and a second plate non-folding region respectively overlapping the first non-folding region and the second non-folding region in a plan view, and the openings may be formed in the plate folding region.

In an embodiment, the display device may further include a cushion layer disposed below the support member, wherein the cushion layer may include a first cushion part including a first portion overlapping the first vertical part in a cross-sectional view, and a second cushion part including a second portion overlapping the second vertical part in a cross-sectional view.

In an embodiment, the first vertical part may be positioned more adjacent to the upper plate than a lower surface of the first cushion part in case that the first cushion part is applied with a first pressure in a direction perpendicular to the plane, and the second vertical part may be positioned more adjacent to the upper plate than a lower surface of the second cushion part in case that the second cushion part is applied with the first pressure in a direction perpendicular to the plane, and the first pressure may be about 1 MPa or less.

BRIEF DESCRIPTION OF THE FIGURES

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1A:
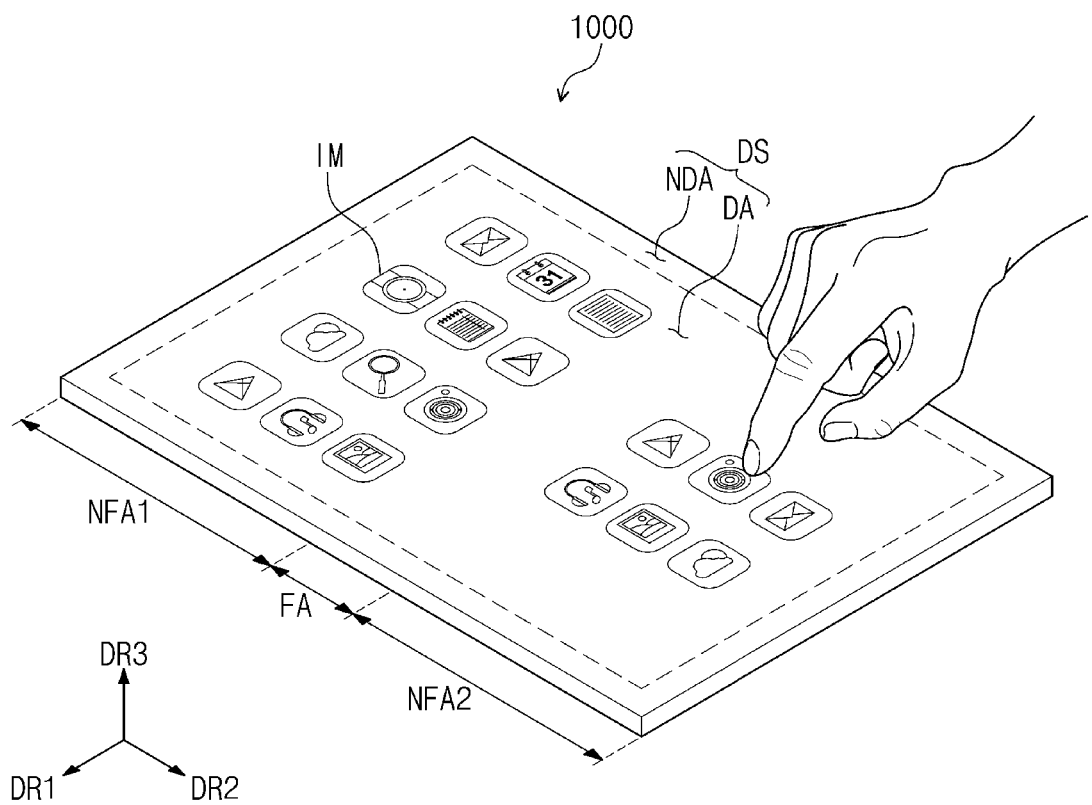
FIG. 1A is a schematic perspective view of a display device according to an embodiment of the disclosure.

Hereinafter, embodiments of the disclosure will be described with reference to the accompanying drawings.

As used herein, the singular forms, "a," "an," and "the" are intended to include the plural forms as well (and vice versa), unless the context clearly indicates otherwise.

In the disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements may be exaggerated for an effective description of technical aspects. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing from the scope of rights of the disclosure.

In addition, terms such as "below," "lower," "above," "upper," and the like are used to describe the relationship of components shown in the drawings. The terms are used as a relative concept and are described with reference to the direction indicated in the drawings.

It should be understood that the terms "comprise", "have", and "include" are intended to specify the presence of stated features, integers, steps, operations, elements, components, or combinations thereof in the disclosure, but do not preclude the presence or addition of one or more other features, integers, steps, operations, elements, components, or combinations thereof.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

Unless otherwise defined, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About", "approximately", and "substantially" are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 1B:
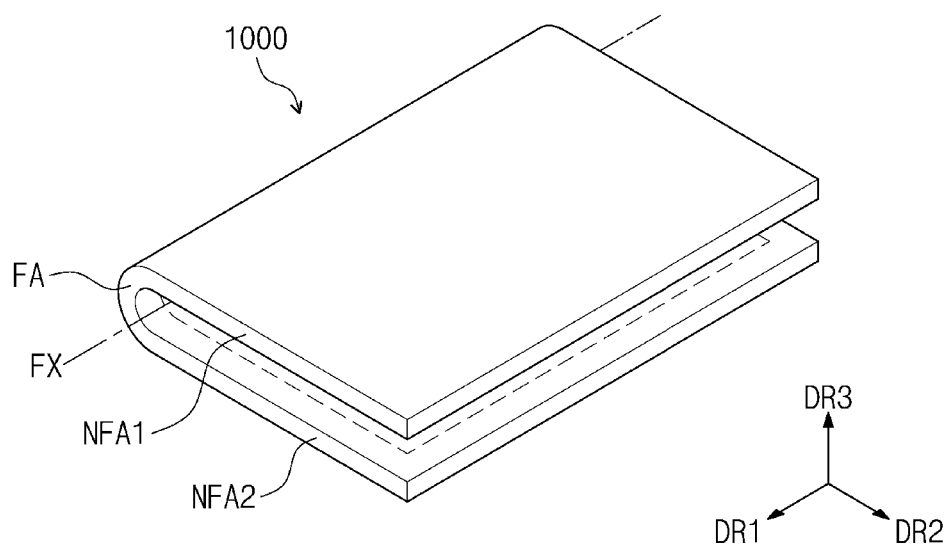
FIG. 1B is a schematic view illustrating the display device illustrated in FIG. 1A in a folded state.

FIG. 1A is a schematic perspective view of a display device according to an embodiment of the disclosure. FIG. 1B is a schematic view illustrating the display device illustrated in FIG. 1A in a folded state.

Referring to FIG. 1A and FIG. 1B, a display device 1000 may be a foldable display device. A display device 1000 according to the disclosure may be used in large-sized electronic devices such as televisions and monitors, and also in small-and-medium-sized electronic devices such as mobile phones, tablet computers, car navigation systems, game machines, and smart watches.

An upper surface of the display device 1000 may be defined as a display surface DS, and in an unfolded state, that is, in the state in which the display device 1000 is flat, the display surface DS may have a plane defined by a first direction DR1 and a second direction DR2.

The display surface DS may include a display region DA and a non-display region NDA around the display region DA. The display region DA may be a region in which an image IM may be displayed, and the non-display region NDA may be a region in which the image IM may not be displayed. In FIG. 1A, as an example of the image IM, application icons are illustrated.

The display region DA may have a quadrangular shape. The non-display region NDA may surround the display region DA. However, embodiments are not limited thereto. The shape of the display region DA and the shape of the non-display region NDA may be correlatively designed.

In the display device 1000, a first non-folding region NFA1, a folding region FA, and a second non-folding region NFA2 may be sequentially defined along the second direction DR2. For example, the folding region FA may be defined between the first non-folding region NFA1 and the second non-folding region NFA2. FIG. 1A and FIG. 1B illustrate one folding region FA and the first and second non-folding regions NFA1 and NFA2. However, the number of the folding regions FA and the first and second non-folding regions NFA1 and NFA2 is not limited thereto. For example, the display device 1000 may include more than two non-folding regions, and folding regions disposed between the non-folding regions.

The display device 1000 may be foldable based on a folding axis FX. For example, the folding region FA may be bent based on the folding axis FX. The folding axis FX may be extended along the first direction DR1. The folding axis FX may be defined as a short axis parallel to a short side of the display device 1000.

In case that the display device 1000 is folded, a display surface of the first non-folding region NFA1 and a display surface of the second non-folding region NFA2 may face each other. Therefore, in a folded state, the display surface DS may not be exposed to the outside. However, this is only an example, and embodiments are not limited thereto. In an embodiment of the disclosure, in case that the display device 1000 is folded, the display surface of the first non-folding region NFA1 and the display surface of the second non-folding region NFA2 may oppose each other. Therefore, in a folded state, the display surface DS may be exposed to the outside.

Figure 2A:
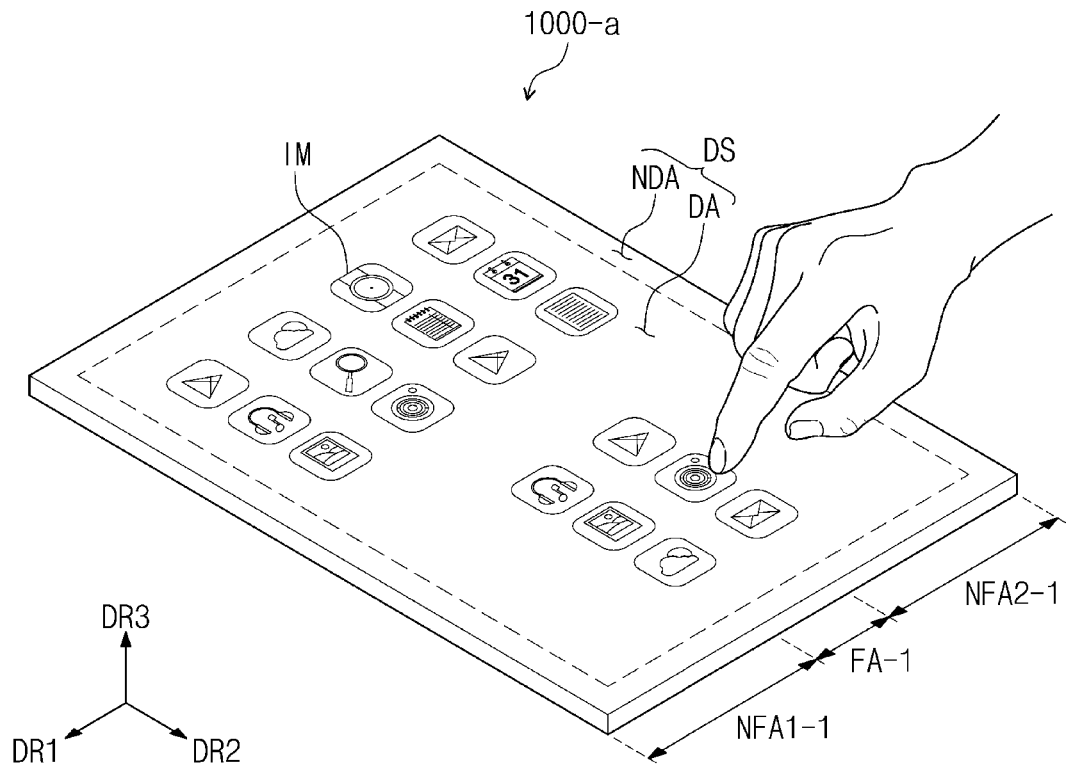
FIG. 2A is a schematic perspective view of a display device according to an embodiment of the disclosure.
Figure 2B:
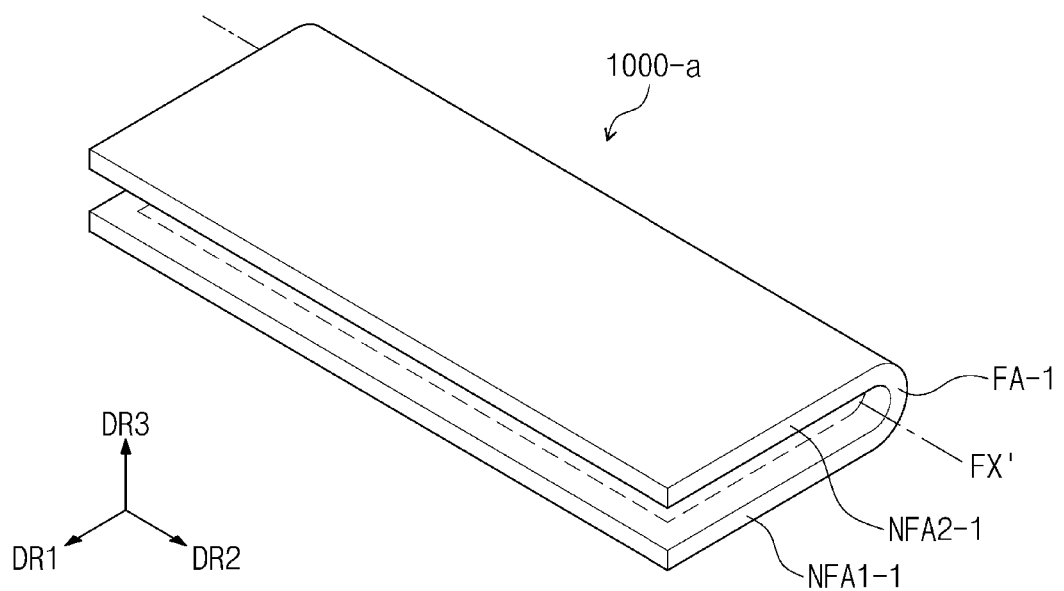
FIG. 2B is a schematic view illustrating the display device illustrated in FIG. 2A in a folded state.

FIG. 2A is a schematic perspective view of a display device according to an embodiment of the disclosure. FIG. 2B is a schematic view illustrating the display device illustrated in FIG. 2A in a folded state.

Referring to FIG. 2A and FIG. 2B, in a display device 1000-a, a first non-folding region NFA1-1, a folding region FA-1, and a second non-folding region NFA2-1 may be sequentially defined along the first direction DR1. The folding region FA-1 may be defined between the first non-folding region NFA1-1 and the second non-folding region NFA2-1.

The display device 1000-a may be foldable based on a folding axis FX-1. For example, the folding region FA-1 may be bent based on the folding axis FX-1. The folding axis FX-1 may be extended along the second direction DR2. The folding axis FX-1 may be defined as a long axis parallel to a long side of the display device 1000-a.

Hereinafter, the structure of the display device 1000 which may be foldable based on the short axis will be described. However, embodiments are not limited thereto. Structures to be described later may also be applied to the display device 1000-a which is foldable based on the long axis.

Figure 3:
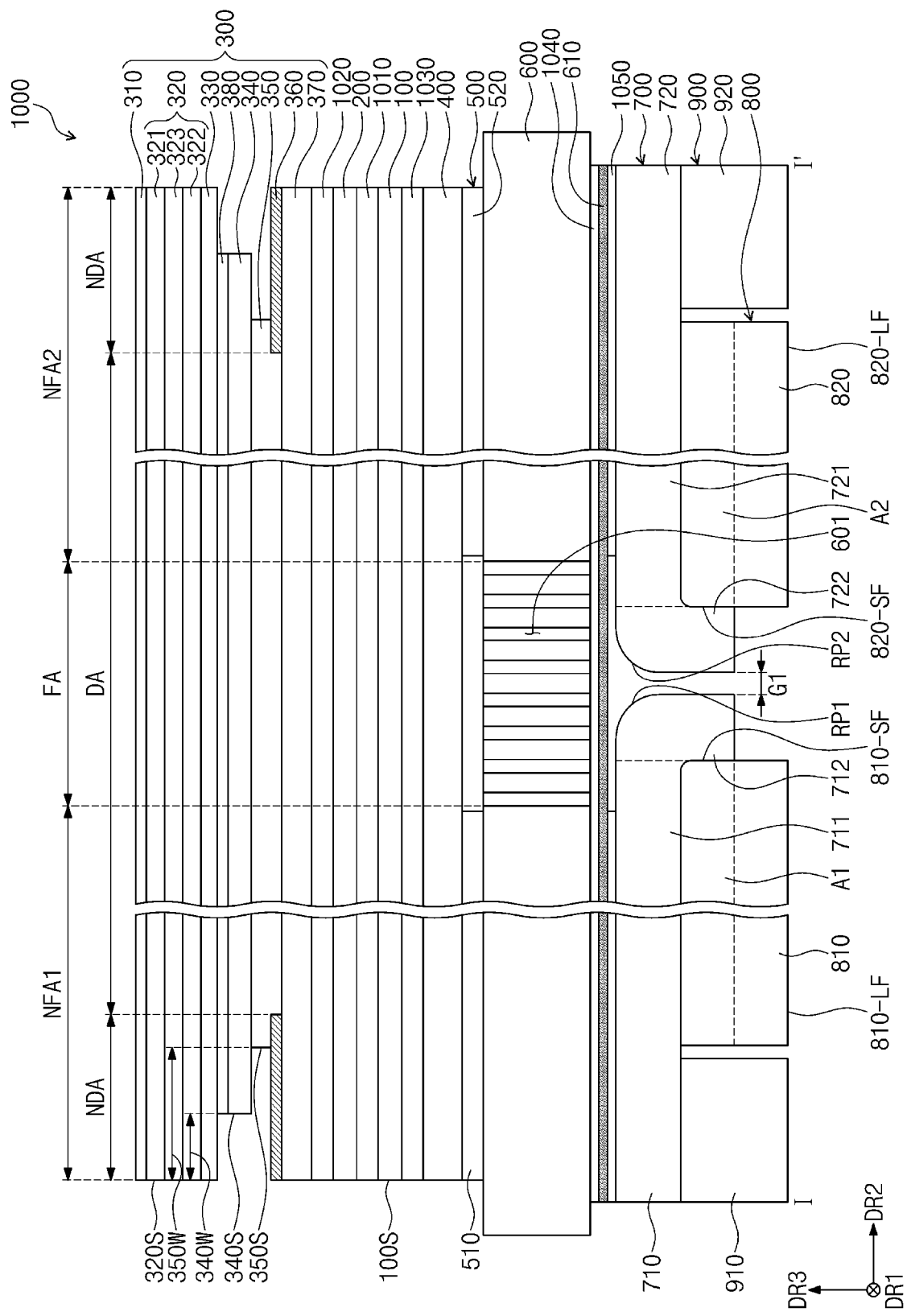
FIG. 3 is a schematic cross-sectional view of a display device according to an embodiment of the disclosure.
Figure 4:
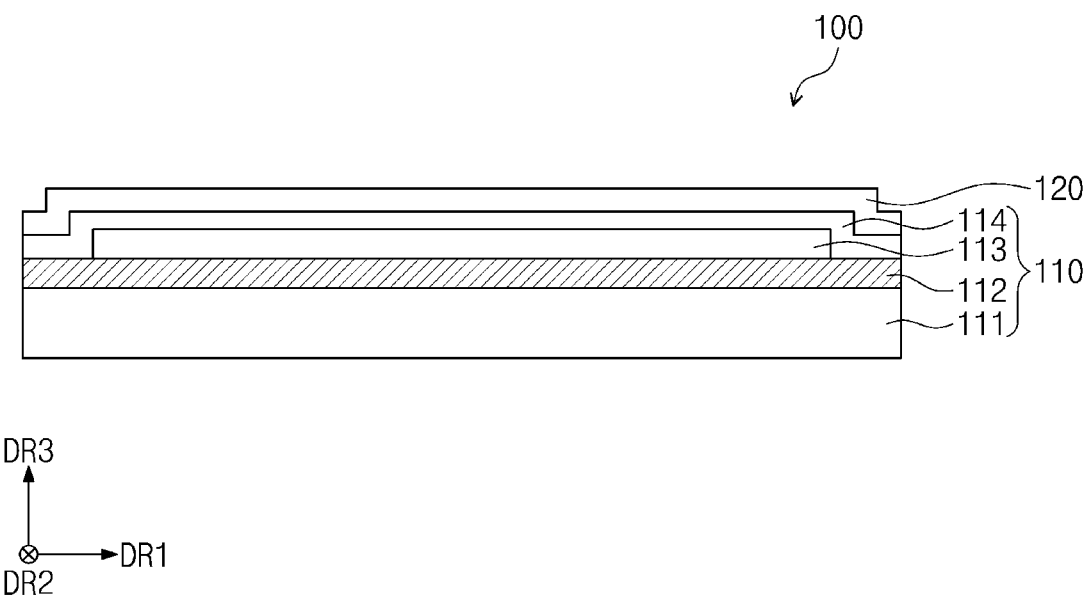
FIG. 4 is a schematic cross-sectional view of a display panel according to an embodiment of the disclosure.
Figure 5A:
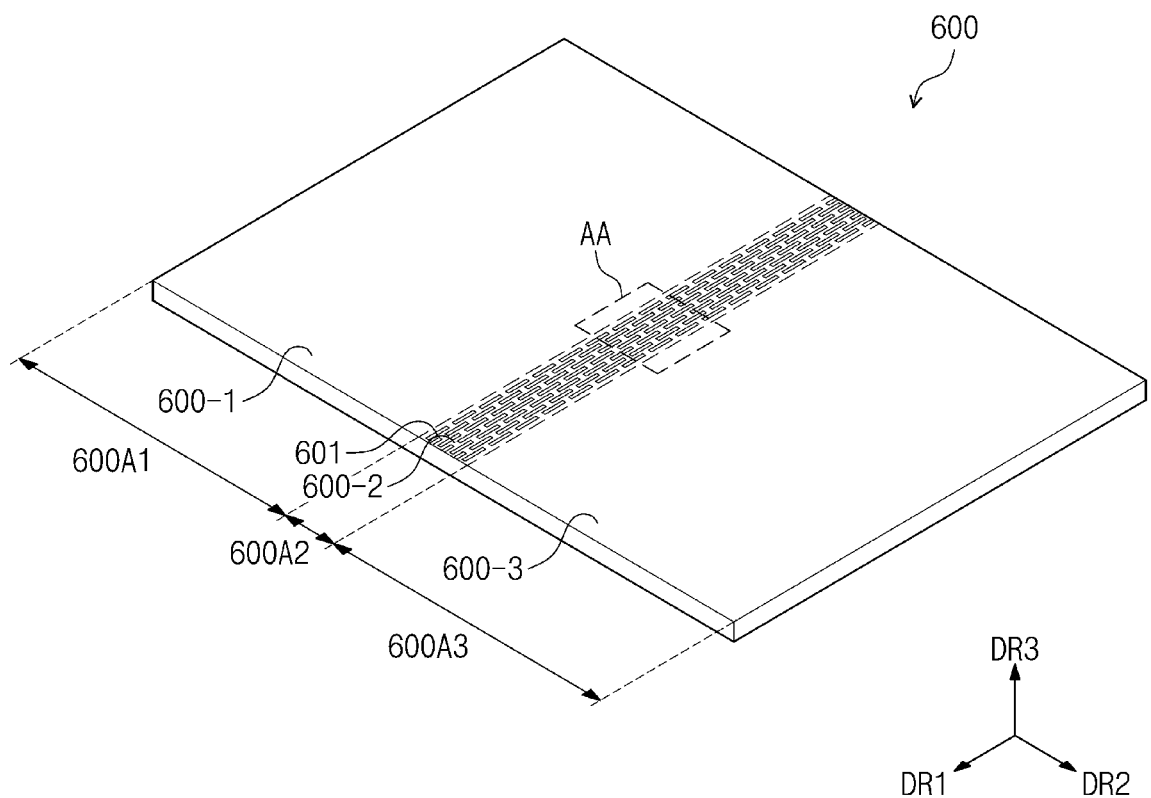
FIG. 5A is a schematic perspective view of various components included in a display device according to an embodiment of the disclosure.
Figure 5B:
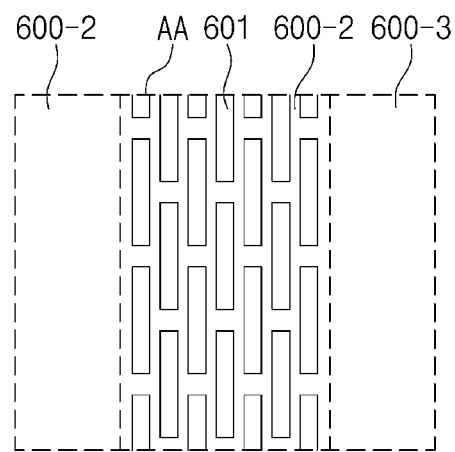
FIG. 5B is a schematic plan view of a portion overlapping region AA of FIG. 5A among various components of a display device according to an embodiment of the disclosure.
Figure 5C:
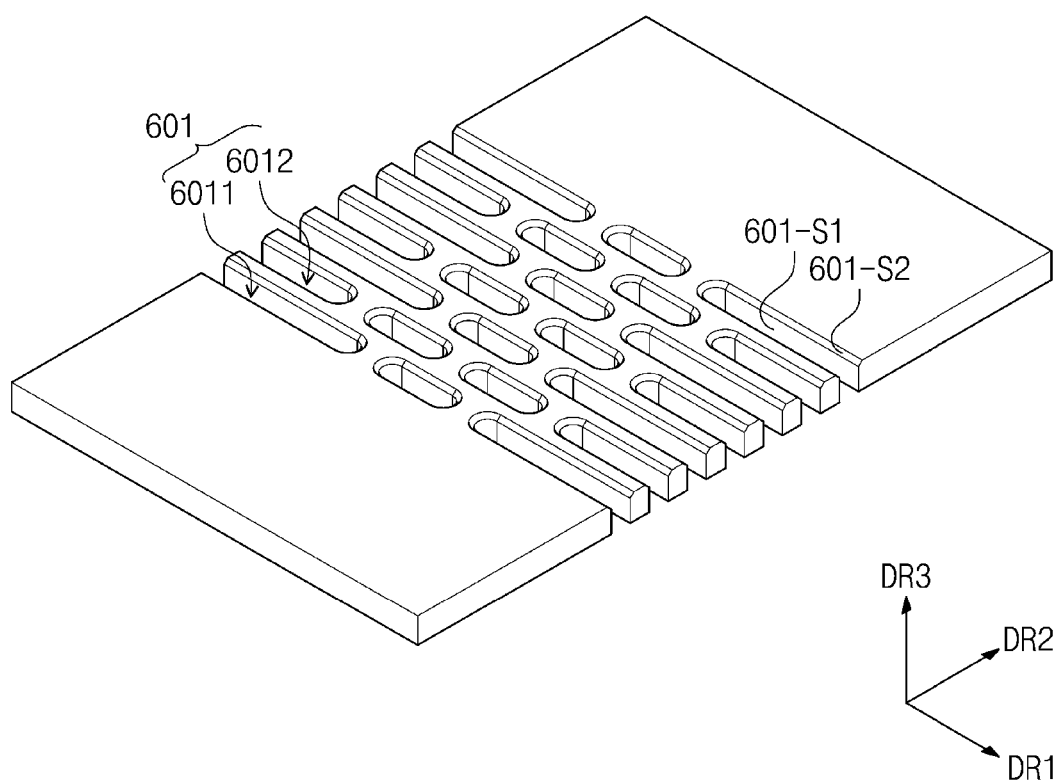
FIG. 5C is a schematic perspective view of a portion overlapping region AA of FIG. 5A among various components of a display device according to an embodiment of the disclosure.

FIG. 3 is a schematic cross-sectional view of a display device according to an embodiment of the disclosure. In FIG. 3, cross-sectional views of a display device taken along I-I' of FIG. 1A are illustrated. FIG. 4 is a schematic cross-sectional view of a display panel according to an embodiment of the disclosure. FIG. 5A is a schematic perspective view of various components included in a display device according to an embodiment of the disclosure. FIG. 5B is a schematic plan view of a portion overlapping region AA of FIG. 5A among various components of a display device according to an embodiment of the disclosure. FIG. 5C is a schematic perspective view of a portion overlapping region AA of FIG. 5A among various components of a display device according to an embodiment of the disclosure. In FIG. 3 and FIG. 4, the display device 1000 illustrated in FIG. 1A is illustratively described. However, embodiments are not limited thereto. A similar description may be applied to the display device 1000-a illustrated in FIG. 2A and FIG. 2B. FIG. 5A illustrates a perspective view of an upper plate 600 in a display device according to an embodiment of the disclosure. FIG. 5B illustrates a plan view of a portion in the upper plate 600 overlapping region AA of FIG. 5A. FIG. 5C illustrates a perspective view of a portion in the upper plate 600 overlapping region AA of FIG. 5A.

Referring to FIG. 3, the display device 1000 may include a display panel 100, upper functional layers, and lower functional layers.

Referring to FIG. 4 first, the display panel 100 may be a component configured to generate an image and sense an input applied from the outside. For example, the display panel 100 may include a display layer 110 and a sensor layer 120. The thickness of the display panel 100 may be about 25 micrometers (μm) to about 45 micrometers (μm). For example, the thickness of the display panel 100 may be about 35 micrometers, but the thickness of the display panel 100 is not limited thereto.

The display layer 110 may be a component which substantially generates an image. The display layer 110 may be a light emission type display layer. For example, the display layer 110 may be an organic light emission display layer, a quantum-dot display layer, or a micro-LED display layer. Depending on the configuration of the display layer 110, the display panel 100 may be an organic light emission display panel, a quantum-dot display panel, or a micro-LED display panel.

The display layer 110 may include a base layer 111, a circuit layer 112, a light emission element layer 113, and an encapsulation layer 114.

The base layer 111 may include a synthetic resin film. A synthetic resin layer may include a thermosetting resin. Particularly, the synthetic resin layer may be a polyimide-based resin layer, and the material thereof is not particularly limited. The synthetic resin layer may include at least one of an acrylic resin, a methacrylic resin, polyisoprene, a vinyl-based resin, an epoxy-based resin, a urethane-based resin, a cellulose-based resin, a siloxane-based resin, a polyamide-based resin, and a perylene-based resin. The base layer 111 may include a glass substrate, an organic/inorganic composite material substrate, or the like.

The base layer 111 may have a multi-layered structure. For example, the base layer 111 may include a first synthetic resin layer, a silicon oxide ($SiO_x$) layer disposed on the first synthetic resin layer, an amorphous silicon layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. Each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, a "specific functional group-based resin" means a resin including a "specific functional group."

The thickness of the base layer 111 film may be about 10 micrometers to about 30 micrometers. For example, the thickness of the base layer 111 may be about 20 micrometers.

The circuit layer 112 may be disposed on the base layer 111. The circuit layer 112 may include an insulation layer, a semiconductor pattern, a conductive pattern, a signal line, and the like. The insulation layer, a semiconductor layer, and a conductive layer are formed on the base layer 111 by coating, deposition, or the like, and thereafter, the insulation layer, the semiconductor layer, and the conductive layer may be selectively patterned through performing a photolithography process multiple times. Thereafter, the semiconductor pattern, the conductive pattern, and the signal line which are included in the circuit layer 112 may be formed.

The light emission element layer 113 may be disposed on the circuit layer 112. The light emission element layer 113 may include a light emission element. For example, the light emission element layer 113 may include an organic light emission material, a quantum dot, a quantum rod, or a micro LED.

The sum of the thicknesses of the circuit layer 112 and the light emission element layer 113 may be about 1 micrometer to about 5 micrometers. For example, the sum of the thicknesses of the circuit layer 112 and the light emission element layer 113 may be about 3 micrometers.

The encapsulation layer 114 may be disposed on the light emission element layer 113. The encapsulation layer 114 may include an inorganic layer, an organic layer, and an inorganic layer sequentially stacked on each other, but layers constituting the encapsulation layer 114 are not limited thereto.

The inorganic layers may protect the light emission element layer 113 from moisture and oxygen, and the organic layer may protect the light emission element layer 113 from foreign materials such as dust particles. The inorganic layers may include a silicon nitride layer, a silicon oxynitride layer, a silicon oxide layer, a titanium oxide layer, an aluminum oxide layer, or the like. The organic layer may include an acrylic organic layer, but embodiments are not limited thereto.

The thickness of the encapsulation layer 114 may be about 3 micrometers to about 10 micrometers. For example, the thickness of the encapsulation layer 114 may be about 6 micrometers.

The sensor layer 120 may be disposed on the display layer 110. The sensor layer 120 may sense an external input applied from the outside. The external input may be a user input. The user input may include various forms of external inputs such as a part of a user's body, light, heat, a pen, and pressure.

The sensor layer 120 may be formed on the display layer 110 through a series of processes. The sensor layer 120 may be directly disposed on the display layer 110. For example, a third element may not be disposed between the sensor layer 120 and the display layer 110, and the sensor layer 120 and the display layer 110 may come into contact with each other. For example, a separate adhesive member may not be disposed between the sensor layer 120 and the display layer 110. In case that the sensor layer 120 is directly disposed on the display layer 110, the thickness of the sensor layer 120 may be, for example, about 2 micrometers.

In other embodiments, the sensor layer 120 and the display layer 110 may be coupled to each other through an adhesive member. The adhesive member may include a typical adhesive or pressure-sensitive adhesive. For example, the adhesive member may include a pressure sensitive adhesive film (PSA), an optically clear adhesive film (OCA), an optically clear resin (OCR), or the like.

Referring back to FIG. 3, the upper functional layers may be disposed on the display panel 100. For example, the upper functional layers may include a reflection prevention member 200 and an upper member 300.

The reflection prevention member 200 may be referred to as a reflection prevention layer. The reflection prevention member 200 may reduce the reflectance of external light incident from the outside. The reflection prevention member 200 may include a stretchable synthetic resin film. For example, the reflection prevention member 200 may be provided by dyeing a polyvinyl alcohol film (PVA film) with an iodine compound. However, this is only an example. Materials constituting the reflection prevention member 200 are not limited thereto. The thickness of the reflection prevention member 200 may be about 3 micrometers to about 5 micrometers, but the thickness of the reflection prevention member 200 is not limited thereto.

The reflection prevention member 200 according to an embodiment may include color filters. The color filters may have a specific arrangement. In the reflection prevention member 200, the arrangement of the color filters may be determined in consideration of emission colors of pixels included in the display layer 110. The reflection prevention layer may further include a black matrix adjacent to the color filters.

The reflection prevention member 200 according to an embodiment may include a destructive interference structure. For example, the destructive interference structure may include a first reflection layer and a second reflection layer disposed on different layers. First reflection light and second reflection light respectively reflected from the first reflection layer and the second reflection layer may be destructively interfered, and accordingly, the reflectance of external light may be reduced.

The reflection prevention member 200 may be coupled to the display panel 100 through a first adhesive layer 1010. The first adhesive layer 1010 may be a transparent adhesive layer such as a pressure sensitive adhesive (PSA) film, an optically clear adhesive (OCA) film, or an optically clear resin (OCR). An adhesive layer described hereinafter may include a typical adhesive or pressure-sensitive adhesive. The thickness of the first adhesive layer 1010 may be about 20 micrometers to about 30 micrometers, for example, about 25 micrometers. However, the thickness of the first adhesive layer 1010 is not limited thereto.

In an embodiment of the disclosure, the first adhesive layer 1010 may be omitted. The reflection prevention member 200 may be directly disposed on the display panel 100. A separate adhesive layer may not be disposed between the reflection prevention member 200 and the display panel 100. In case that the reflection prevention member 200 is directly disposed on the display panel 100, the thickness of the reflection prevention member 200 may be, for example, about 4.8 micrometers.

The upper member 300 may be disposed on the reflection prevention member 200. The upper member 300 may include a first hard coating layer 310, a protection layer 320, a first upper adhesive layer 330, a window 340, a second upper adhesive layer 350, a black matrix 360, an impact absorbing layer 370, and a second hard coating layer 380. Elements included in the upper member 300 are not limited to the elements described above. At least some of the above-described elements may be omitted, and other elements may be added.

The first hard coating layer 310 may be a layer disposed on the outermost surface of the display device 1000. The first hard coating layer 310 is a functional layer for improving the use properties of the display device 1000, and may be provided (e.g., coated) on the protection layer 320. For example, due to the first hard coating layer 310, fingerprint prevention properties, contamination prevention properties, scratch prevention properties, and the like may be improved. The thickness of the first hard coating layer 310 may be about 1 micrometer to about 5 micrometers, for example, about 3 micrometers.

The protection layer 320 may be disposed below the first hard coating layer 310. The protection layer 320 may protect components disposed below the protection layer 320. The first hard coating layer 310, a fingerprint prevention layer, and the like may be additionally provided to the protection layer 320 in order to improve properties such as chemical resistance and wear resistance. The protection layer 320 may include a film having an elastic modulus of about 15 GPa or lower at room temperature. The thickness of the protection layer 320 may be about 30 micrometers to about 200 micrometers, but the thickness of the protection layer 320 is not limited thereto. In an embodiment, the protection layer 320 may be omitted. The protection layer 320 may have a multi-layered structure. For example, the protection layer 320 may include multiple synthetic resin films 321 and 322 which may be coupled to each other by an adhesive. The protection layer 320 may include a first protection layer 321, a second protection layer 322, and a protection adhesive layer 323 which couples the two. In the protection layer 320, the thickness of each of the first protection layer 321 and the second protection layer 322 may be about 30 micrometers to about 120 micrometers. For example, the thickness of the first protection layer 321 may be about 100 micrometers, and the thickness of the second protection layer 322 may be about 40 micrometers.

The first upper adhesive layer 330 may be disposed below the protection layer 320. The protection layer 320 and the window 340 may be coupled to each other by the first upper adhesive layer 330. The thickness of the first upper adhesive layer 330 may be about 20 micrometers to about 60 micrometers, for example, about 50 micrometers. However, the thickness of the first upper adhesive layer 330 is not limited thereto.

The window 340 may be disposed below the first upper adhesive layer 330. The window 340 may include an optically transparent insulation material. For example, the window 340 may include a glass substrate or a synthetic resin film. In case that the window 340 is a glass substrate, the thickness of the window 340 may be about 80 micrometers or less, for example, about 40 micrometers. However, the thickness of the window 340 is not limited thereto.

In case that the window 340 is a synthetic resin film, the window 340 may include a polyimide (PI) film or a polyethylene terephthalate (PET) film.

The window 340 may have a multi-layered structure or a single-layered structure. For example, the window 340 may include multiple synthetic resin films coupled with an adhesive, or a glass substrate and a synthetic resin film coupled with an adhesive.

On an upper surface of the window 340, the second hard coating layer 380 may be disposed. The second hard coating layer 380 is a functional layer for improving the use properties of the display device 1000, and may be provided (e.g., coated) on the upper surface of the window 340. For example, due to the second hard coating layer 380, fingerprint prevention properties, contamination prevention properties, scratch prevention properties, and the like may be improved. The thickness of the second hard coating layer 380 may be about 1 micrometer to about 5 micrometers, for example, about 1.5 micrometers.

The second upper adhesive layer 350 may be disposed below the window 340. The window 340 and the impact absorbing layer 370 may be coupled to each other by the second upper adhesive layer 350. The thickness of the second upper adhesive layer 350 may be about 30 micrometers to about 40 micrometers, for example, about 35 micrometers. However, the thickness of the second upper adhesive layer 350 is not limited thereto.

In an embodiment of the disclosure, a sidewall 340S of the window 340 and a sidewall 350S of the second upper adhesive layer 350 may be disposed further inside than sidewalls of other layers, for example, a sidewall 100S of the display panel 100 and a sidewall 320S of the protection layer 320. Being disposed further inside may mean being closer to the display region DA than other comparison targets.

Due to a folding operation of the display device 1000, the positional relationship between each layer may be changed. According to an embodiment of the disclosure, since the sidewall 340S of the window 340 may be disposed further inside than the sidewall 100S of the display panel 100 and the sidewall 320S of the protection layer 320, even in case that the positional relationship between each layer is changed, the sidewall 340S of the window 340 is less likely to be more protruded than the sidewall 320S of the protection layer 320. Therefore, the likelihood of an external impact being transmitted through the sidewall 340S of the window 340 may be reduced. As a result, cracks are less likely to be generated on the window 340.

A first distance 340W between the sidewall 340S of the window 340 and the sidewall 320S of the protection layer 320 may be of a distance or greater. Here, the first distance 340W may refer to a distance in a direction parallel to the second direction DR2. When viewed in cross-section, the first distance 340W may correspond to the distance between the sidewall 340S and the sidewall 320S.

The first distance 340W may be about 180 micrometers to about 205 micrometers, for example, about 196 micrometers, but is not limited thereto. For example, the first distance 340W may be about 50 micrometers or greater, and may be about 300 micrometers. As the first distance 340W increases, the protection layer 320 may protrude more than the window 340, and a portion of the protection layer 320 may be bent and attached to other elements, for example, a case and the like. As the area of the protection layer 320 increases, foreign matters introduced from an upper portion of the protection layer 320 may be less likely to be introduced to a lower portion of the protection layer 320.

Through a lamination process, the window 340 and the second upper adhesive layer 350 may be adhered to the impact absorbing layer 370. In consideration of a lamination process tolerance, the area of the window 340 and the second upper adhesive layer 350 may be smaller than the area of the impact absorbing layer 370. The area of the second upper adhesive layer 350 may be less than the area of the window 340. For example, in a process of attaching the window 340, pressure may be applied to the second upper adhesive layer 350. With the pressure, the second upper adhesive layer 350 may be extended in a direction parallel to the first direction DR1 and the second direction DR2. At this time, the area of the second upper adhesive layer 350 may be less than the area of the window 340 such that the second upper adhesive layer 350 does not protrude more than the window 340.

In case that the first upper adhesive layer 330 and the second upper adhesive layer 350 are attached, the window 340 may not slip during a folding operation of the display device 1000, and thus, a buckling phenomenon may occur in the window 340. However, according to an embodiment of the disclosure, the area of the second upper adhesive layer 350 may be less than the area of the window 340. Therefore, the first upper adhesive layer 330 may not be attached to the second upper adhesive layer 350, and foreign matters may be less likely to be attached to the second upper adhesive layer 350.

A second distance 350W between the sidewall 350S of the second upper adhesive layer 350 and the sidewall 320S of the protection layer 320 may be of a distance or greater. Here, the second distance 350W may refer to a distance in a direction parallel to the second direction DR2. When viewed in cross-section, the second distance 350W may correspond to the distance between the sidewall 350S and the sidewall 320S.

The second distance 350W may be about 392 micrometers, but is not limited thereto. For example, the second distance 350W may be selected from a range between about 292 micrometers and about 492 micrometers, but is not limited to the range. The black matrix 360 may be disposed between the impact absorbing layer 370 and the second upper adhesive layer 350. The black matrix 360 may be provided (e.g., printed) on an upper surface of the impact absorbing layer 370. The black matrix 360 may overlap the non-display region NDA. The black matrix 360 may be a colored layer, and may be formed in a coating manner. The black matrix 360 may include a colored organic substance or an opaque metal, but materials constituting the black matrix 360 are not limited thereto.

FIG. 3 illustrates that the black matrix 360 may be disposed on the upper surface of the impact absorbing layer 370, but the position of the black matrix 360 is not limited thereto. For example, the black matrix 360 may be provided on an upper surface of the protection layer 320, a lower surface of the protection layer 320, the upper surface of the window 340, or a lower surface of the window 340. The black matrix 360 may be provided as multiple layers, in which case, some of the layers may be provided on the upper surface of the impact absorbing layer 370, and others thereof may be provided on the upper surface of the protection layer 320, the lower surface of the protection layer 320, the upper surface of the window 340, or the lower surface of the window 340.

The impact absorbing layer 370 may be a functional layer for protecting the display panel 100 from an external impact. The impact absorbing layer 370 may be selected from films having an elastic modulus of about 1 GPa or greater at room temperature. The impact absorbing layer 370 may be a stretchable film having an optical function. For example, the impact absorbing layer 370 may be an optical axis control film. The thickness of the impact absorbing layer 370 may be about 35 micrometers to about 45 micrometers, for example, about 41 micrometers. However, the thickness of the impact absorbing layer 370 is not limited thereto. In an embodiment of the disclosure, the impact absorbing layer 370 may be omitted.

In case that the impact absorbing layer 370 is omitted, the reflection prevention member 200 may be adhered to the window 340 through an adhesive layer. The reflection prevention member 200 may come into contact with a lower surface of a second adhesive layer 1020, and the window 340 may come into contact with an upper surface of the second adhesive layer 1020. In case that the impact absorbing layer 370 is omitted, the black matrix 360 may be disposed on the upper surface of the protection layer 320, the lower surface of the protection layer 320, the upper surface of the window 340, or the lower surface of the window 340.

Although not illustrated, on a surface of the impact absorbing layer 370, a planarization layer may be provided. In an embodiment, the impact absorbing layer 370 may include a curved surface, and at least one surface of the upper surface and the lower surface of the impact absorbing layer 370 may further include the planarization layer for filling the curve. Accordingly, haze which may be generated on the uneven surface of the impact absorbing layer 370 may be prevented.

The upper member 300 may be coupled to the reflection prevention member 200 through the second adhesive layer 1020. The second adhesive layer 1020 may include a typical adhesive or pressure-sensitive adhesive. The thickness of the second adhesive layer 1020 may be about 20 micrometers to about 60 micrometers, for example, about 50 micrometers. However, the thickness of the second adhesive layer 1020 is not limited thereto.

The lower functional layers may be disposed below the display panel 100. For example, the lower functional layers may include a panel protection film 400, a support adhesive layer 500, a support member, and a cushion layer 800. Elements included in the lower functional layers are not limited to the elements described above. At least some of the above-described elements may be omitted, and other elements may be added.

The panel protection film 400 may be coupled to a rear surface of the display panel 100 through a third adhesive layer 1030. The panel protection film 400 may prevent scratches from being generated on the rear surface of the display panel 100 during a manufacturing process of the display panel 100. The panel protection film 400 may be a colored polyimide film. For example, the protection film 400 may be an opaque yellow film, but is not limited thereto.

The thickness of the panel protection film 400 may be about 20 micrometers to about 50 micrometers. For example, the thickness of the panel protection film 400 may be about 32 micrometers. The thickness of the third hard coating layer 1030 may be about 13 micrometers to about 40 micrometers, for example, about 25 micrometers. However, the thickness of the panel protection film 400 and the thickness of the third adhesive layer 1030 are not limited thereto.

The support adhesive layer 500 may be disposed below the panel protection film 400. The support adhesive layer 500 may have a color. The support adhesive layer 500 may protect the rear surface of the display panel 100, and also prevent a rear surface reflection problem of the display panel 100 caused by light. The support adhesive layer 500 may be formed of a material having a high light absorption rate.

The support adhesive layer 500 may be disposed between the panel protection film 400 and the upper plate 600. The support adhesive layer 500 may couple the panel protection film 400 and the upper plate 600. The support adhesive layer 500 may include a first support adhesive layer 510 and a second support adhesive layer 520 spaced apart from each other.

The first support adhesive layer 510 and the second support adhesive layer 520 may be spaced apart with multiple openings 601 formed in the upper plate 600 interposed therebetween. In plan view, the support adhesive layer 500 may not overlap the openings 601 formed in the upper plate 600. The support adhesive layer 500 may be spaced apart from the openings 601 formed in the upper plate 600.

The first support adhesive layer 510 may overlap the first non-folding region NFA1, and the second support adhesive layer 520 may overlap the second non-folding region NFA2. Since the support adhesive layer 500 may not be disposed in a region corresponding to the folding region FA, the flexibility of the upper plate 600 may increase.

The support member may include the upper plate 600 and a lower plate 700. Elements included in the support member are not limited to the elements described above. Other elements may be added in addition to the above-described elements. The support member may be disposed between the upper plate 600 and the lower plate 700, and further include a fifth adhesive layer 1050 for attaching the upper plate 600 and the lower plate 700.

The upper plate 600 may support components disposed thereabove. The heat dissipation performance of the display device 1000 may be improved due to the upper plate 600.

A cover layer 610 may be attached to the upper plate 600 by a fourth adhesive layer 1040. The fourth adhesive layer 1040 may include a typical adhesive or pressure-sensitive adhesive. Unlike what is illustrated in FIG. 3, the fourth adhesive layer 1040 may not be disposed in a region overlapping the folding region FA in the upper plate 600. The cover layer 610 may cover the openings 601 formed on the upper plate 600. Therefore, it is possible to further prevent foreign matters from being introduced to the openings 601 formed on the upper plate 600.

The cover layer 610 may include a material having an elastic modulus lower than the elastic modulus of the upper plate 600. The cover layer 610 may include a material having an elastic modulus of about 30 MPa or less, and an elongation of about 100% or greater. For example, the cover layer 610 may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin. For example, the cover layer 610 may include thermoplastic polyurethane, but embodiments are not limited thereto. The cover layer 610 may be a thermoplastic polyurethane film having a mash pattern formed thereon.

The thickness of the fourth adhesive layer 1040 may be about 4 micrometers to about 15 micrometers, for example, about 8 micrometers. The thickness of the cover layer 610 may be about 4 micrometers to about 15 micrometers, for example, about 8 micrometers. However, the thickness of the fourth adhesive layer 1040, and the thickness of the cover layer 610 are not limited to the above-described numerical values.

On a portion of the upper plate 600, the openings 601 may be formed. The openings 601 may be formed in a region overlapping the folding region FA. For example, when viewed in the third direction DR3, the openings 601 may overlap the folding region FA. The shape of the portion of the upper plate 600 may be more easily changed due to the openings 601.

In the display device 1000 of an embodiment, the thickness of the upper plate 600 may be greater than the thickness of the lower plate 700. The thickness of the upper plate 600 may be about 100 micrometers to about 300 micrometers. For example, the thickness of the upper plate 600 may be about 150 micrometers.

The upper plate 600 may include a highly rigid material. The upper plate 600 may include at least one of stainless steel, a titanium alloy, a nickel alloy, a beryllium alloy, and nitinol. For example, the upper plate 600 may include at least one of SUS304, SUS316, titanium copper, nickel copper, beryllium copper, and nitinol.

Referring to FIG. 3, and FIG. 5A to FIG. 5C together, the upper plate 600 included in a display device according to an embodiment may include a first plate non-folding region 600A1, a plate folding region 600A2, and a second plate non-folding region 600A3 which may be arranged along the second direction DR2. The plate folding region 600A2 of the upper plate 600 may overlap the folding region FA of the display device 1000. The first plate non-folding region 600A1 and the second plate non-folding region 600A3 of the upper plate 600 may be connected to the plate folding region 600A2, and at least a portion of the first plate non-folding region 600A1 may overlap the first non-folding region NFA1 of the display device 1000, and at least a portion of the second plate non-folding region 600A3 may overlap the second non-folding region NFA2 of the display device 1000. At least a portion in the first plate non-folding region 600A1 and the second plate non-folding region 600A3 may overlap the non-display region NDA of the display device 1000. The upper plate 600 may include a first portion 600-1 overlapping the first plate non-folding region 600A1, a second portion 600-2 overlapping the plate folding region 600A2, and a third portion 600-3 overlapping the second plate non-folding region 600A3.

In the upper plate 600, the openings 601 overlapping the plate folding region 600A2 may be formed. The openings 601 may overlap the folding region FA of the display device 1000. The openings 601 may be provided in multiple rows. The openings 601 may be provided in rows arranged to be shifted from each other. In an embodiment, the openings 601 may include multiple first openings 6011 arranged in a first row and multiple second openings 6012 arranged in a second row. Each of the first openings 6011 may be extended in the first direction DR1, and spaced apart from each other in the first direction DR1. Each of the second openings 6012 may be spaced apart from the first openings 6011 in the second direction DR2, extended in the first direction DR1, and spaced apart from each other in the first direction DR1. The first openings 6011 and the second openings 6012 may be alternately formed along the second direction DR2.

An inner side surface of the openings 601 may include a first side surface 601-S1 and a second side surface 601-S2. The first side surface 601-S1 may be a surface defining each of the openings 601. The second side surface 601-S2 may be a surface which connects an upper surface of the upper plate 600 and the first side surface 601-S1 with an inclination. The second side surface 601-S2 may be a surface obtained by chamfering a corner between the upper surface of the upper plate 600 and the first side surface 601-S1.

The width of each of the openings 601 formed on the upper plate 600 may be about 50 micrometers or less. Each of the openings 601 formed on the upper plate 600 may have a width of about 50 micrometers or less along the second direction DR2.

The openings 601 may be formed to penetrate the entire upper plate 600 in a thickness direction. For example, the penetration depth of the openings 601 may be substantially the same as the thickness of the upper plate 600. However, embodiments are not limited thereto. The openings 601 may be formed to penetrate only a portion of the upper plate 600 in the thickness direction. For example, the openings may have a groove shape etched by half the thickness of the upper plate 600 by half-etching a portion of the upper plate 600.

Referring back to FIG. 3, the display device 1000 according to an embodiment of the disclosure may include the lower plate 700 disposed below the upper plate 600. The lower plate 700 may be provided in plurality, and the lower plates 700 may be disposed spaced apart from each other. For example, one lower plate 700 may be disposed in the first non-folding region NFA1, and another lower plate 700 may be disposed in the second non-folding region NFA2.

The lower plate 700 may include a first lower plate 710 disposed in the first non-folding region NFA1 and a second lower plate 720 disposed in the second non-folding region NFA2. Each of the first lower plate 710 and the second lower plate 720 may overlap a portion in the folding region FA. The first lower plate 710 and the second lower plate 720 may be disposed spaced apart from each other by a gap G1. The gap G1 by which the first lower plate 710 and the second lower plate 720 may be spaced apart from each other may be defined to overlap the folding region FA. The lower plates 700 may be disposed spaced apart from each other in the folding region FA, but may be disposed as closest as possible to support a region in which the openings 601 of the upper plate 600 may be formed. For example, the lower plates 700 may prevent the shape of the region in which the openings 601 of the upper plate 600 may be formed from being changed by pressure applied from above.

The first lower plate 710 may include a first horizontal part 711 and a first vertical part 712. The first horizontal part 711 may be parallel to the display panel 100. For example, the first horizontal part 711 may be parallel to a plane formed by the first direction DR1 and the second direction DR2. The first horizontal part 711 may have substantially a uniform thickness in the third direction DR3. The first vertical part 712 may be extended from the first horizontal part 711, and bent toward a first cushion part 810. For example, the first vertical part 712 may be bent in a direction away from the display panel 100. Accordingly, the first vertical part 712 may include a first round part RP1 bent with a first radius of curvature. In an embodiment, the first radius of curvature may be about 1 mm or less.

The second lower plate 720 may include a second horizontal part 721 and a second vertical part 722. The second horizontal part 721 may be parallel to the display panel 100. For example, the second horizontal part 721 may be parallel to the plane formed by the first direction DR1 and the second direction DR2. The second horizontal part 721 may have substantially a uniform thickness in the third direction DR3. The second vertical part 722 may be extended from the second horizontal part 721, and bent toward a second cushion part 820. For example, the second vertical part 722 may be bent in a direction away from the display panel 100. Accordingly, the second vertical part 722 may include a second round part RP2 bent with a second radius of curvature. In an embodiment, the second radius of curvature may be about 1 mm or less.

The first horizontal part 711 and the second horizontal part 721 may have substantially the same thickness. In the disclosure, in case that the thicknesses of two components are "substantially the same," it may mean that the two components have physically the exact same thickness, and also mean that the two components have the same thickness within an error range that may occur in a process. In an embodiment, the thickness of each of the first horizontal part 711 and the second horizontal part 721 may be about 50 micrometers to about 100 micrometers. For example, the thickness of each of the first horizontal part 711 and the second horizontal part 721 may be about 80 micrometers. However, embodiments are not limited thereto.

In an embodiment, each of the first vertical part 721 and the second vertical part 722 may overlap the folding region FA on a plane. The first vertical part 712 and the second vertical part 722 may be disposed spaced apart from each other by the gap G1. The gap G1 by which the first vertical part 712 and the second vertical part 722 may be spaced apart from each other may be defined to overlap the folding region FA. The gap G1 by which the first vertical part 712 and the second vertical part 722 are spaced apart from each other may be smaller than the region in the upper plate 600 on which the openings 601 are defined. In the disclosure, the gap G1 by which the first vertical part 712 and the second vertical part 722 may be spaced apart from each other may be defined as a horizontal distance between lower edges of an outer surface of each of the first vertical part 712 and the second vertical part 722.

Each of the first vertical part 712 and the second vertical part 722 may be extended in parallel to the third direction DR3. Each of the first vertical part 712 and the second vertical part 722 may be disposed more adjacent to the upper plate 600 than a lower surface of the cushion layer 800. For example, the first vertical part 712 may be disposed more adjacent to the upper plate 600 than a lower surface 810-LF of the first cushion part 810, and the second vertical part 722 may be disposed more adjacent to the upper plate 600 than a lower surface 820-LF of the second cushion part 820.

The first vertical part 712 may overlap at least a portion of the first cushion part 810 on a cross-section, and the second vertical part 722 may overlap at least a portion of the second cushion part 820 on a cross-section. As illustrated in FIG. 3, the first vertical part 712 may be in contact with at least a portion of a side surface 810-SF of the first cushion part 810, and the second vertical part 722 may be in contact with at least a portion of a side surface 820-SF of the second cushion part 820. However, embodiments are not limited thereto. The first vertical part 712 and the second vertical part 722 may not respectively be in contact with the side surface 810-SF of the first cushion part 810, and the side surface 820-SF of the second cushion part 820. The first vertical part 712 may be disposed spaced apart from the side surface 810-SF of the first cushion part 810 at an interval, and the second vertical part 722 may be disposed spaced apart from the side surface 820-SF of the second cushion part 820 at an interval.

In the support member disposed below the display panel 100, in case that the support member includes the upper plate 600 having a pattern such as the openings 601 formed therein to overlap the folding region FA, and a lower plate disposed below the upper plate 600 and spaced apart therefrom in the folding region FA, a local pressing may occur due to an edge portion of the lower plate spaced apart in a pattern region of the upper plate 600. For example, due to a repeated folding operation or load applied from the outside, an interference phenomenon may occur between the pattern region of the upper plate 600 having the openings 601 formed therein and the edge portion of the upper plate spaced apart in the folding region FA. In case that the interference phenomenon occurs repetitively, cracks may be generated and spread on a thin film disposed above the upper plate 600, which may substantially cause the breakage of a display device.

In the disclosure, by producing an edge portion of each of the first upper plate 710 and the second upper plate 720 included in the lower plate 700 and overlapping the folding region FA to be bent in a direction away from the display panel 100, the interference phenomenon occurring in the pattern region of the upper plate 600 may be suppressed. More specifically, the first lower plate 710 and the second lower plate 720 may respectively include the first vertical part 712 and the second vertical part 722 overlapping the folding region FA and bent in a direction away from the display panel 100. Accordingly, a stress concentration phenomenon due to the interference phenomenon in the pattern region may be prevented, so that the impact resistance properties of a display device may be further improved.

Each of the lower plates 700 may be attached to the upper plate 600 by the fifth adhesive layer 1050. For example, a fifth adhesive layer 1050 may be attached to a lower surface of the upper plate 600 overlapping the first non-folding region NFA1, and another fifth adhesive layer 1050 may be attached to a lower surface of the upper plate 600 overlapping the second non-folding region NFA2. For example, the fifth adhesive layer 1050 may not overlap the folding region FA. Each of the fifth adhesive layers 1050 may be about 8 micrometers to about 15 micrometers, for example, 8 micrometers. However, the thickness of each of the fifth adhesive layers 1050 is not limited thereto.

The lower plate 700 may include a metal alloy. Each of the first lower plate 710 and the second lower plate 720 may include a metal alloy. For example, each of the first lower plate 710 and the second lower plate 720 may include a copper alloy. Accordingly, the lower plate 700 may stably protect the display panel 100 from an impact generated from the outside (e.g., outside the display device).

Although not illustrated, a step compensation film may be further disposed between each of lower plates 700 and the upper plate 600. For example, the step compensation film may be provided in a region overlapping the folding region FA. The adhesion force of one surface of the step compensation film may be lower than the adhesion force of the other surface opposing the one surface. For example, the one surface may not have adhesion force. The one surface may be a surface facing the upper plate 600.

The display device 1000 may include the cushion layer 800 and a step compensation member 900 which may be disposed below the lower plate 700. In an embodiment, the cushion layer 800 may be disposed below the lower plate 700. The cushion member 800 may protect the display panel 100 from an impact transferred from below. The impact resistance properties of the display device 1000 may be improved due to the cushion member 800.

The cushion layer 800 may include synthetic resin foam, sponge, or the like, or a combination thereof. The cushion layer 800 may have elasticity, and may have a porous structure.

The cushion layer 800 may include polyurethane. For example, the cushion layer 800 may include thermoplastic polyurethane. However, embodiments are not limited thereto. The cushion layer 800 may include various materials as long as they are for absorbing an impact.

The thickness of the cushion layer 800 may be about 100 micrometers to about 300 micrometers. For example, the thickness of the cushion layer 800 may be about 150 micrometers. However, the thickness of the cushion layer 800 is not limited thereto.

The cushion layer 800 may include the first cushion part 810 and the second cushion part 820 spaced apart from each other in the second direction DR2. The first cushion part 810 and the second cushion part 820 may be disposed spaced apart from each other in the folding region FA. The first cushion part 810 may overlap the first non-folding region NFA1, and the second cushion part 820 may overlap the second non-folding region NFA2. The first cushion part 810 may be disposed below the first lower plate 710, and the second cushion part 820 may be disposed below the second lower plate 720. Since the cushion layer 800 may be provided as the first cushion part 810 and the second cushion part 820 spaced apart from each other in the folding region FA, the folding or bending properties of the display device 1000 may be improved. Although not illustrated, the display device 1000 of an embodiment may further include an adhesive layer disposed between the lower plate 700 and the cushion layer 800. The first cushion part 810 may include a first portion A1 overlapping the first vertical part 712 of the first lower plate 710 on a cross-section, and the second cushion part 820 may include a second portion A2 overlapping the second vertical part 722 of the second lower plate 720 on a cross-section.

In case that the first cushion part 810 is applied with a first pressure in a direction perpendicular to a plane parallel to the display panel 100, that is, the third direction DR3, the first vertical part 712 may be positioned more adjacent to the upper plate 600 than the lower surface 810-LF of the first cushion part 810. For example, even in case that the first cushion part 810 is contracted by the first pressure, the first vertical part 712 may not protrude below the lower surface 810-LF of the first cushion part 810. In case that the second cushion part 820 is applied with the first pressure in the direction perpendicular to the plane parallel to the display panel 100, that is, the third direction DR3, the second vertical part 722 may be positioned more adjacent to the upper plate 600 than the lower surface 820-LF of the second cushion part 820. For example, even in case that the second cushion part 820 is contracted by the first pressure, the second vertical part 722 may not protrude below the lower surface 820-LF of the second cushion part 820. Accordingly, a phenomenon in which the first lower plate 710 and the second lower plate 720 are respectively separated from the first cushion part 810 and the second cushion part 820 is suppressed, so that damage to a display device may be prevented. In an embodiment, the first pressure may be about 1 MPa less.

The step compensation member 900 may be disposed below the support member. The step compensation member 900 may be disposed below the lower plate 700. The first cushion part 810 may be disposed below a portion of the first lower plate 710, and a first step compensation member 910 may be disposed below another portion of the first lower plate 710. The second cushion part 820 may be disposed below a portion of the second lower plate 720, and a second step compensation member 920 may be disposed below another portion of the second lower plate 720.

Although not illustrated, the step compensation member 900 may include a first compensation adhesive layer, the step compensation film, and a second compensation adhesive layer. The first compensation adhesive layer may be attached to a lower surface of the lower plate 700 and an upper surface of the step compensation film. The step compensation film may be a synthetic resin film. The second compensation adhesive layer may be attached to a lower surface of the step compensation film and a set (not shown). The display device 1000 according to an embodiment may further include a heat dissipation sheet disposed below the lower plate 700, and an insulation sheet. The heat dissipation sheet may be a thermally conductive sheet having high thermal conductivity. For example, the heat dissipation sheet may include a heat dissipation layer, a heat dissipation adhesive layer, and a gap tape.

FIG. 6A to FIG. 6D are schematic cross-sectional views of a support member according to an embodiment of the disclosure. FIG. 6A to FIG. 6D illustrate only the components disposed below a display panel. Hereinafter, in describing the support member according to an embodiment of the disclosure with reference to FIG. 6A to FIG. 6D, the same reference numerals are given to the components described above with reference to FIG. 3, and detailed descriptions thereof will be omitted.

Figure 6A:
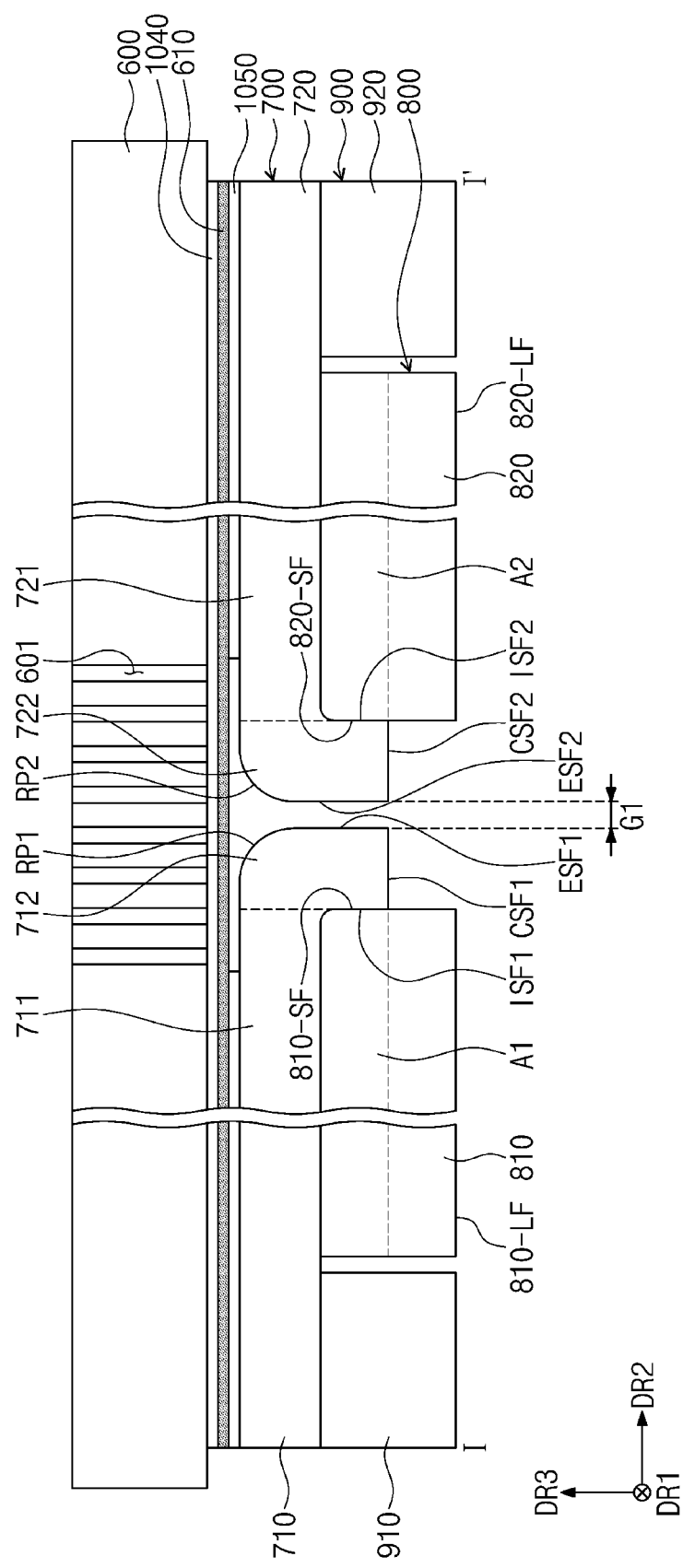
FIG. 6A to FIG. 6D are schematic cross-sectional views of a display device according to an embodiment of the disclosure.

Referring to FIG. 6A, the lower plate 700 of the support member may include the first lower plate 710 and the second lower plate 720. The first lower plate 710 may include the first horizontal part 711 and the first vertical part 712, and the second lower plate 720 may include the second horizontal part 721 and the second vertical part 722. The first vertical part 712 may include the first round part RP1 bent with the first radius of curvature, and the second vertical part 722 may include the second round part RP2 bent with the second radius of curvature. Each the first radius of curvature and the second radius of curvature may be about 1 mm or less.

The first vertical part 712 may include a first inner surface ISF1, a first outer surface ESF1, and a first connection surface CSF1. The first inner surface ISF1 of the first vertical part 712 may be extended from a lower surface of the first horizontal part 711, and the first outer surface ESF1 of the first vertical part 712 may be extended from an upper surface of the first horizontal part 711. The first inner surface ISF1 may be adjacent to the first cushion part 810, and the first outer surface ESF1 may oppose the first inner surface ISF1 and be spaced apart from the first cushion part 810. The first inner surface ISF1 and the first outer surface ESF1 of the first vertical part 712 may be parallel to each other.

In an embodiment, the first outer surface ESF1 may have a bent shape. For example, the first outer surface ESF1 may include a curved region having a curvature and a planar region adjacent to the curved region. The curved region of the first outer surface ESF1 may correspond to the first round part RP1, and the curved region of the first outer surface ESF1 may include a curved surface having the first radius of curvature. The planar region of the first outer surface ESF1 may be extended in the third direction DR3. The first connection surface CSF1 may be a surface connecting the first inner surface ISF1 and the first outer surface ESF1. The first connection surface CSF1 may be parallel to the plane defined by the first direction DR1 and the second direction DR2.

The second vertical part 722 may include a second inner surface ISF2, a second outer surface ESF2, and a second connection surface CSF2. The second inner surface ISF2 of the second vertical part 722 may be extended from a lower surface of the second horizontal part 721, and the second outer surface ESF2 of the second vertical part 722 may be extended from an upper surface of the second horizontal part 721. The second inner surface ISF2 may be adjacent to the second cushion part 820, and the second outer surface ESF2 may oppose the second inner surface ISF2 and be spaced apart from the second cushion part 820. The second inner surface ISF2 and the second outer surface ESF2 of the second vertical part 722 may be parallel to each other.

In an embodiment, the second outer surface ESF2 may have a bent shape. For example, the second outer surface ESF2 may include a curved region having a curvature and a planar region adjacent to the curved region. The curved region of the second outer surface ESF2 may correspond to the second round part RP2, and the curved region of the second outer surface ESF2 may include a curved surface having the second radius of curvature. The planar region of the second outer surface ESF2 may be extended in the third direction DR3. The second connection surface CSF2 may be a surface connecting the second inner surface ISF2 and the second outer surface ESF2. The second connection surface CSF2 may be parallel to the plane defined by the first direction DR1 and the second direction DR2.

In case that the first cushion part 810 is applied with the first pressure in the third direction DR3, the first connection surface CSF1 of the first vertical part 712 may be positioned more adjacent to the upper plate 600 than the lower surface 810-LF of the first cushion part 810, and in case that the second cushion part 820 is applied with the first pressure in third direction DR3, the second connection surface CSF2 of the second vertical part 722 may be positioned more adjacent to the upper plate 600 than the lower surface 820-LF of the second cushion part 820. For example, even in case that the first cushion part 810 is contracted by the first pressure, the first vertical part 712 may not protrude below the lower surface 810-LF of the first cushion part 810, and even in case that the second cushion part 820 is contracted by the first pressure, the second vertical part 722 may not protrude below the lower surface 820-LF of the second cushion part 820.

Figure 6B:
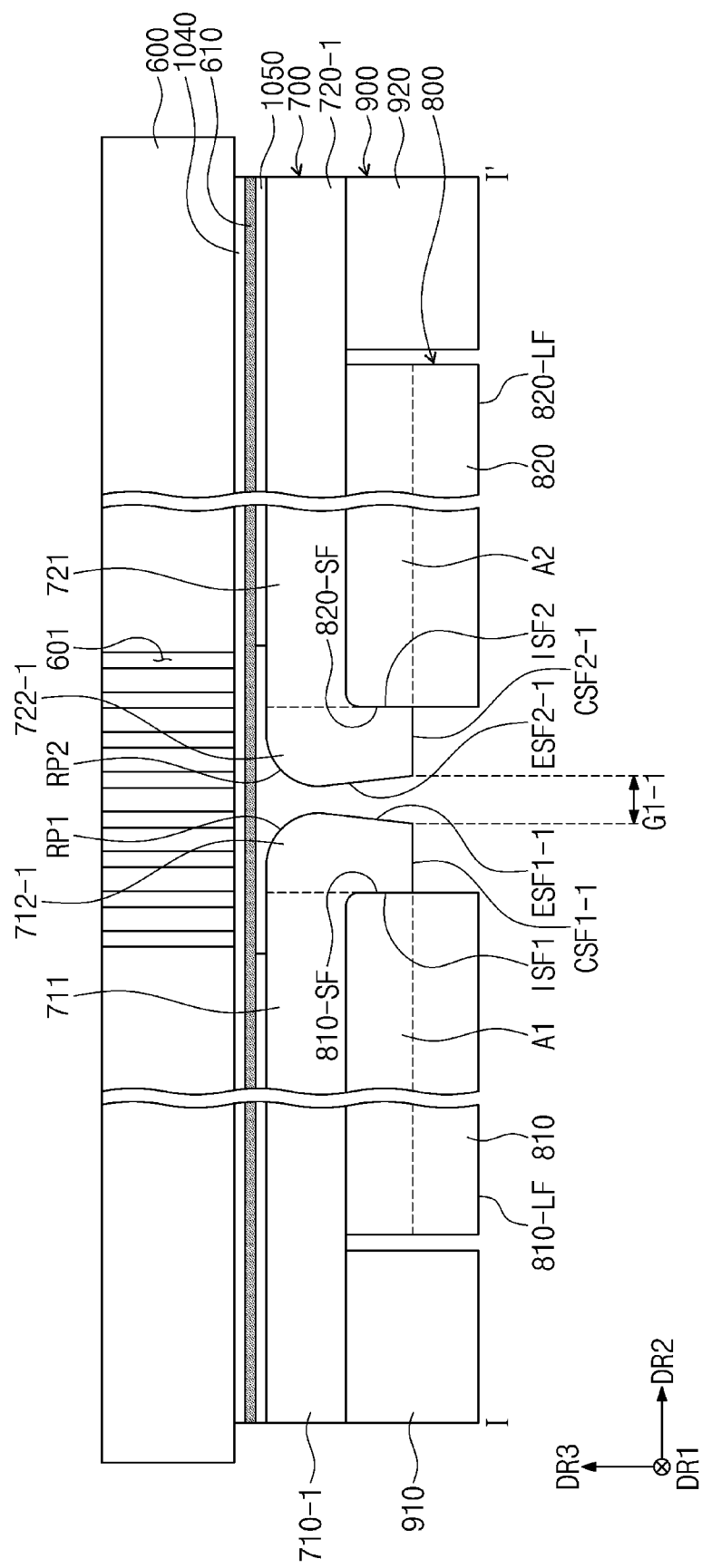
Figure 6C:
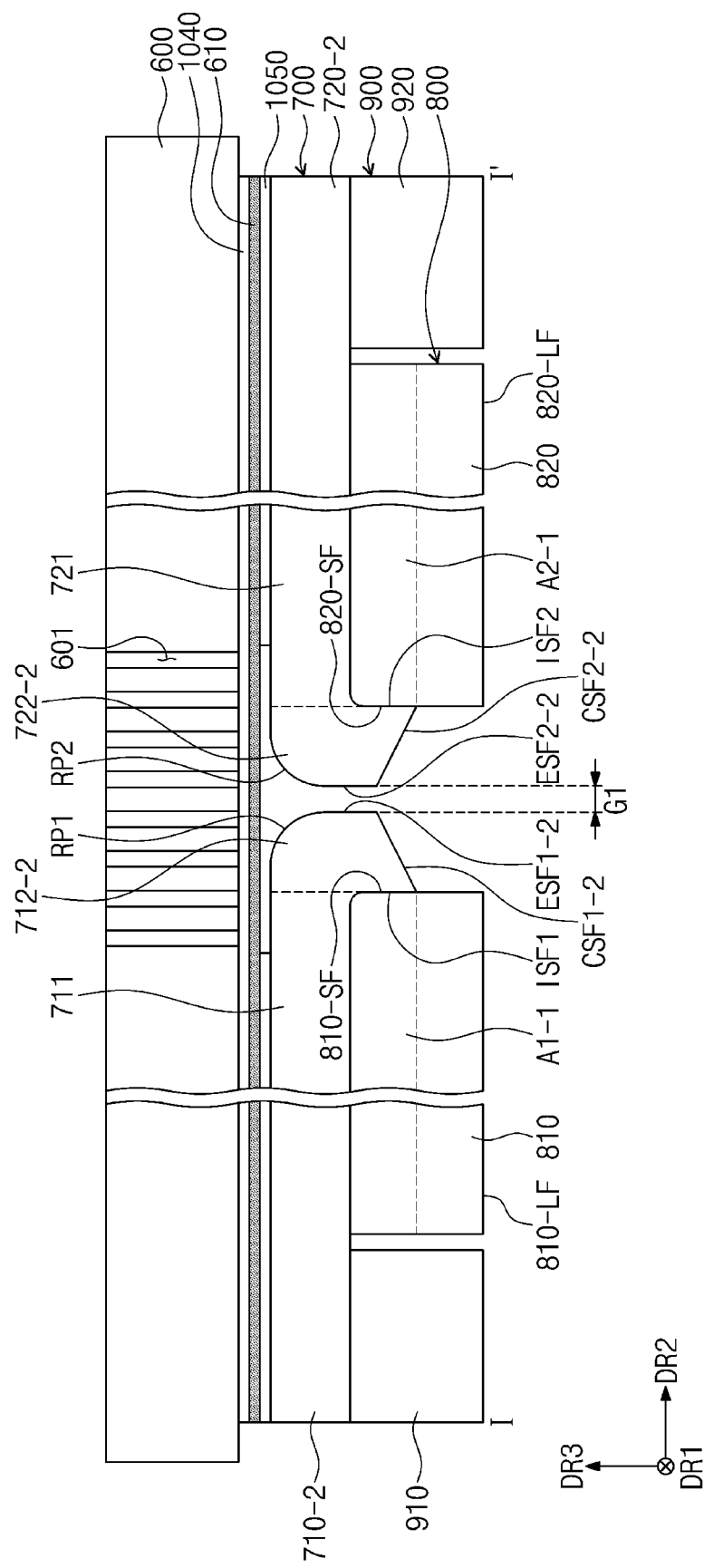
Figure 6D:
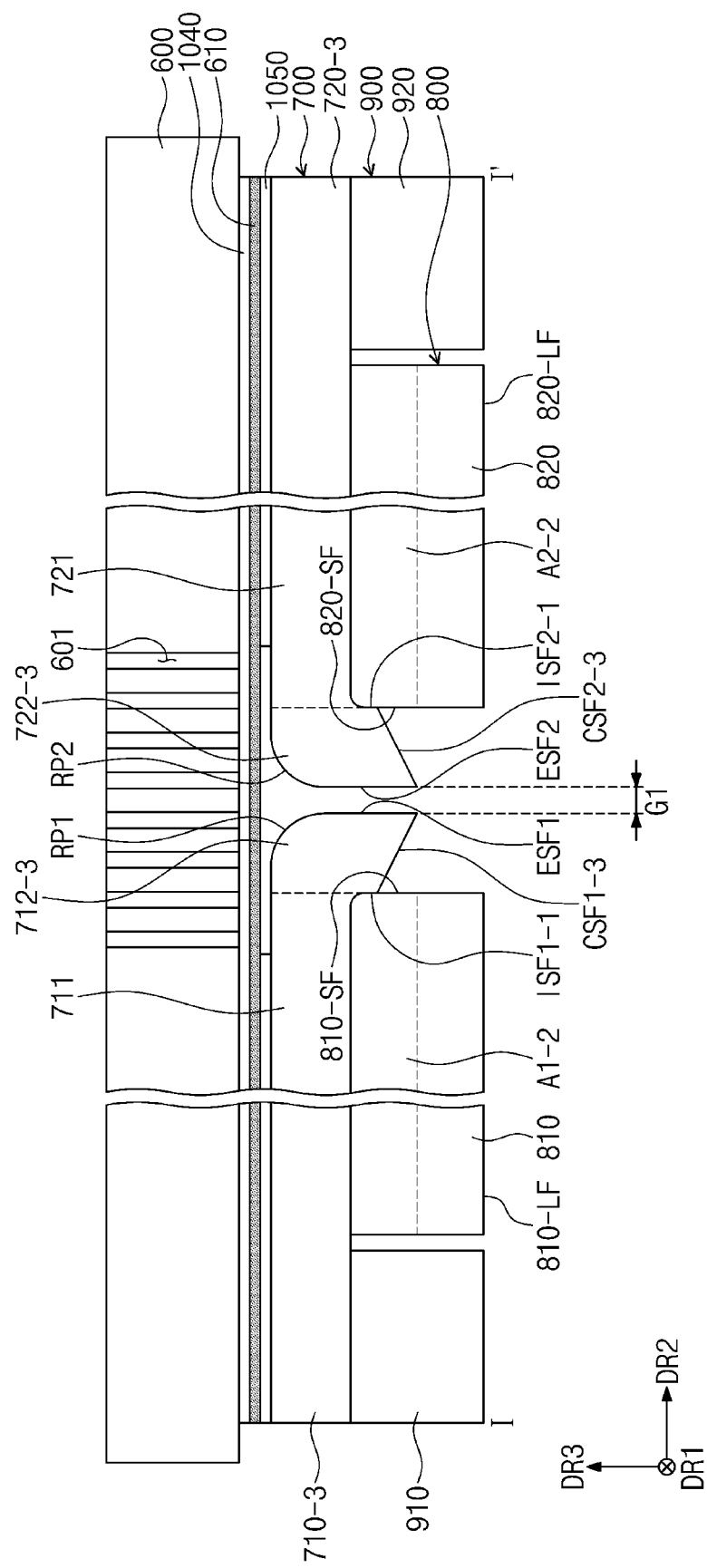

Referring to FIG. 6B to FIG. 6D, in case compared to the support member illustrated in FIG. 6A, the support member according to an embodiment may be different at least in the shape of the upper plate 700.

Referring to FIG. 6B, a first vertical part 712-1 of a first lower plate 710-1 and a second vertical part 722-1 of a second lower plate 720-1 may respectively include a first outer surface ESF1-1 and a second outer surface ESF2-1 including an inclined surface inclined at an angle with respect to a plane defined by the second direction DR2 and the third direction DR3.

The first vertical part 712-1 may include the first inner surface ISF1, the first outer surface ESF1-1, and a first connection surface CSF1-1 which connects the first inner surface ISF1 and the first outer surface ESF1-1. The first outer surface ESF1-1 may include an inclined surface inclined at an angle with respect to the plane defined by the second direction DR2 and the third direction DR3. For example, the first inner surface ISF1 and the first outer surface ESF1-1 of the first vertical part 712-1 may not be parallel to each other, and the first vertical part 712-1 may be tapered from an upper end portion to a lower end portion. Accordingly, the thickness according to the height of the first vertical part 712-1 may reduce from the upper end portion toward the lower end portion.

The second vertical part 722-1 may include the second inner surface ISF2, the second outer surface ESF2-1, and a second connection surface CSF2-1 which connects the second inner surface ISF2 and the second outer surface ESF2-1. The second outer surface ESF2-1 may include an inclined surface inclined at an angle with respect to the plane defined by the second direction DR2 and the third direction DR3. For example, the second inner surface ISF2 and the second outer surface ESF2-1 of the second vertical part 722-1 are not parallel to each other, and the second vertical part 722-1 may be tapered from an upper end portion to a lower end portion. Accordingly, the thickness according to the height of the second vertical part 722-1 may reduce from the upper end portion toward the lower end portion. The thickness of each of the first vertical part 712-1 and the second vertical part 722-1 at any point according to the height may be taken along a line extending perpendicular to the first inner surface ISF1 and the second inner surface ISF2.

The first vertical part 712-1 and the second vertical part 722-1 may be disposed spaced apart from each other by a gap G1-1. Since each of the first vertical part 712-1 and the second vertical part 722-1 may be tapered from the upper end portion to the lower end portion, the gap G1-1 by which the first vertical part 712-1 and the second vertical part 722-1 may be spaced apart from each other may be larger than the gap G1 by which the first vertical part 712 and the second vertical part 722 may be spaced apart from each other, which is illustrated in FIG. 3. The gap G1-1 by which the first vertical part 712-1 and the second vertical part 722-1 may be spaced apart from each other may be defined to overlap the folding region FA (see FIG. 3). The gap G1-1 by which the first vertical part 712-1 and the second vertical part 722-1 may be spaced apart from each other may be smaller than the region in the upper plate 600 in which the openings 601 may be defined.

In FIG. 6A to FIG. 6D, the thickness of each of the first round part RP1 of the first vertical part 712 and the second round part RP2 of the second vertical part 722 is illustrated greater than the thickness of each of the first horizontal part 711 and the second horizontal part 721. However, embodiments are not limited thereto. The thickness of the first round part RP1 and the second round part RP2 may vary depending on process conditions, types of materials, or the like. In the disclosure, the thickness may mean a value that is measured perpendicular to a lower surface (or inner surface) along a line passing through an upper surface (or outer surface).

Referring to FIG. 6C and FIG. 6D, first vertical parts 712-2 and 712-3 of first lower plates 710-2 and 710-3 and second vertical parts 722-2 and 722-3 of second lower plates 720-2 and 720-3 may respectively include first connection surfaces CSF1-2 and CSF1-3 and second connection surfaces CSF2-2 and CSF2-3 including an inclined surface inclined at an angle with respect to the plane defined by the first direction DR1 and the second direction DR2.

Referring to FIG. 6C, the first vertical part 712-2 may include the first inner surface ISF1, a first outer surface ESF1-2, and a first connection surface CSF1-2 which connects the first inner surface ISF1 and the first outer surface ESF1-2. In an embodiment, an end of the first inner surface ISF1 of the first vertical part 712-2 may be more adjacent to the lower surface 810-LF of the first cushion part 810 than an end of the first outer surface ESF1-2 of the first vertical part 712-2. For example, a portion where the first inner surface ISF1 and the first connection surface CSF1-2 of the first vertical part 712-2 meet may be more adjacent to the lower surface 810-LF of the first cushion part 810 than a portion where the first outer surface ESF1-2 and the first connection surface CSF1-2 of the first vertical part 712-2 meet.

The second vertical part 722-2 may include the second inner surface ISF2, a second outer surface ESF2-2, and a second connection surface CSF2-2 which connects the second inner surface ISF2 and the second outer surface ESF2-2. In an embodiment, an end of the second inner surface ISF2 of the second vertical part 722-2 may be more adjacent to the lower surface 820-LF of the second cushion part 820 than an end of the second outer surface ESF2-2 of the second vertical part 722-2. For example, a portion where the second inner surface ISF2 and the second connection surface CSF2-2 of the second vertical part 722-2 meet may be more adjacent to the lower surface 820-LF of the second cushion part 820 than a portion where the second outer surface ESF2-2 and the second connection surface CSF2-2 of the second vertical part 722-2 meet.

The first vertical part 712-2 may overlap at least a portion of the first cushion layer 810, and the second vertical part 722-2 may overlap at least a portion of the second cushion layer 820. Accordingly, the first cushion part 810 may include a first portion A1-1 overlapping the first vertical part 712-2 on a cross-section, and the second cushion part 820 may include a second portion A2-1 overlapping the second vertical part 722-2 on a cross-section. The first portion A1-1 may mean a portion overlapping the first inner surface ISF1 of the first vertical part 712-2, and the second portion A2-1 may mean a portion overlapping the second inner surface ISF2 of the second vertical part 722-2.

Referring to FIG. 6D, the first vertical part 712-3 may include a first inner surface ISF1-1, the first outer surface ESF1, and a first connection surface CSF1-3 which connects the first inner surface ISF1-1 and the first outer surface ESF1. In an embodiment, an end of the first outer surface ESF1 of the first vertical part 712-3 may be more adjacent to the lower surface 810-LF of the first cushion part 810 than an end of the first inner surface ISF1-1. For example, a portion where the first outer surface ESF1 and the first connection surface CSF1-3 of the first vertical part 712-3 meet may be more adjacent to the lower surface 810-LF of the first cushion part 810 than a portion where the first inner surface ISF1-1 and the first connection surface CSF1-3 of the first vertical part 712-3 meet.

The second vertical part 722-3 may include a second inner surface ISF2-1, the second outer surface ESF2, and a second connection surface CSF2-3 which connects the second inner surface ISF2-1 and the second outer surface ESF2. In an embodiment, an end of the second outer surface ESF2 of the second vertical part 722-3 may be more adjacent to the lower surface 820-LF of the second cushion part 820 than an end of the second inner surface ISF2-1 of the second vertical part 722-3. For example, a portion where the second outer surface ESF2 and the second connection surface CSF2-3 of the second vertical part 722-3 meet may be more adjacent to the lower surface 820-LF of the second cushion part 820 than a portion where the second inner surface ISF2-1 and the second connection surface CSF2-3 of the second vertical part 722-3 meet.

The first vertical part 712-3 may overlap at least a portion of the first cushion layer 810 on a cross-section, and the second vertical part 722-3 may overlap at least a portion of the second cushion layer 820 on a cross-section. Accordingly, the first cushion part 810 may include a first portion A1-2 overlapping the first vertical part 712-3 on a cross-section, and the second cushion part 820 may include a second portion A2-2 overlapping the second vertical part 722-3 on a cross-section. The first portion A1-2 may mean a portion overlapping the first outer surface ESF1 of the first vertical part 712-3, and the second portion A2-2 may mean a portion overlapping the second outer surface ESF2 of the second vertical part 722-3.

A typical display device may have a problem in that a folding region of the display device may be either cracked or broken due to stress or repeated load generated during a folding operation. Particularly, in case that multiple openings are formed in an upper plate, an interference phenomenon caused by a lower plate may occur in a region where the openings are formed. In case that the interference phenomenon occurs repetitively, a panel protection film, a display panel, or the like disposed above of the upper plate may be damaged, and thus, torn or broken. Accordingly, high stress may be applied or stress may be concentrated on a damaged portion at the time of folding, and thus, fatigue failure may be accelerated to lead to plastic deformation of the display device.

A display device according to an embodiment of the disclosure may include a support member disposed below a display panel, wherein the support member may include an upper plate having multiple openings formed in a folding region, and a lower plate disposed below the upper plate and having a first lower plate and a second lower plate which may be disposed spaced apart from each other and may be bent in a direction away from the display panel. More specifically, the first lower plate may include a first horizontal part parallel to the display panel, and a first vertical part extended from the first horizontal part and including a first round part bent with a first radius of curvature, and the second lower plate includes a second horizontal part parallel to the display panel, and a second vertical part extended from the second horizontal part and including a second round part bent with a second radius of curvature. Accordingly, while components such as a display panel disposed on an upper side of the upper plate may be supported, an interference phenomenon caused by the lower plate and occurring in a folding region portion in the upper plate on which the openings are formed may be suppressed. Therefore, it may be possible to prevent a local stress concentration phenomenon and generation and propagation of a local crack caused by the interference phenomenon. In conclusion, it is possible to provide a display device with improved mechanical reliability since folding properties and impact resistance properties against a repetitive deformation driving environment may be simultaneously ensured.

According to an embodiment of the disclosure, a support member disposed below a display panel may include an upper plate, and first and second lower plates disposed spaced apart below the upper plate, wherein the first and second lower plates respectively include a first vertical part and a second vertical part which are bent in a direction away from the display panel. Therefore, the folding properties and impact resistance properties of a display device may be ensured to improve the reliability of the display device.

Although the disclosure has been described with reference to particular embodiments, it will be understood by those skilled in the art that various changes in form and details may be made therein without departing from the spirit and scope of the disclosure. Accordingly, the technical scope of the disclosure should not be limited solely to the contents set forth in the detailed description, but should be defined by the appended claims, including equivalents thereof.

What is claimed is:

1. A display device comprising:
   a first non-folding region, a folding region, and a second non-folding region which are sequentially defined in a first direction;
   a display panel;
   a support member disposed below the display panel; and
   a cushion layer disposed below the support member and including a first cushion part overlapping the first non-folding region in a plan view, and a second cushion part overlapping the second non-folding region in a plan view, the support member including:
      an upper plate; and
      a lower plate disposed below the upper plate,
   wherein the lower plate includes:
      a first lower plate including:
         a first horizontal part parallel to a plane defined by the first direction and a second direction intersecting the first direction; and
         a first vertical part extended from the first horizontal part and bent toward the first cushion part; and
      a second lower plate spaced apart from the first lower plate by a gap and including:
         a second horizontal part parallel to the plane; and
         a second vertical part extended from the second horizontal part and bent toward the second cushion part, and
   wherein the first vertical part comprises a first inner surface adjacent to the first cushion part, and a first outer surface spaced apart from the first cushion part;
   the second vertical part comprises a second inner surface adjacent to the second cushion part, and a second outer surface spaced apart from the second cushion part; and
   the first vertical part is spaced apart from the second vertical part by the gap.

2. The display device of claim 1, wherein:
the first vertical part comprises a first round part bent with a first radius of curvature,
the second vertical part comprises a second round part bent with a second radius of curvature, and
each of the first radius of curvature and the second radius of curvature is about 1 mm or less.

3. The display device of claim 1, wherein the first vertical part and the second vertical part overlap the folding region in a plan view.

4. The display device of claim 1, wherein the lower plate includes a copper alloy.

5. The display device of claim 1, wherein openings are formed in the upper plate.

6. The display device of claim 5, wherein
the upper plate comprises a plate folding region corresponding to the folding region, and
the openings are formed in the plate folding region.

7. The display device of claim 6, wherein the upper plate comprises a first plate non-folding region, the plate folding region, and a second plate non-folding region which are sequentially arranged in the first direction.

8. The display device of claim 1, wherein the first vertical part and the second vertical part are each extended in a third direction intersecting the first direction and the second direction.

9. The display device of claim 1, wherein:
the first vertical part is disposed more adjacent to the upper plate than a lower surface of the first cushion part; and
the second vertical part is disposed more adjacent to the upper plate than a lower surface of the second cushion part.

10. The display device of claim 1, wherein:
the first vertical part overlaps at least a portion of the first cushion part in a cross-sectional view; and
the second vertical part overlaps at least a portion of the second cushion part in a cross-sectional view.

11. The display device of claim 1, wherein:
the first vertical part contacts at least a portion of a side surface of the first cushion part; and
the second vertical part contacts at least a portion of a side surface of the second cushion part.

12. The display device of claim 1, wherein:
the first vertical part further comprises:
a first connection surface extending between the first inner surface and the first outer surface,
the second vertical part further comprises:
a second connection surface extending between the second inner surface and the second outer surface, and
each of the first connection surface and the second connection surface is one of parallel to the plane, or inclined at an angle with respect to the plane.

13. The display device of claim 12, wherein:
the first connection surface is positioned more adjacent to the upper plate than the lower surface of the first cushion part in case that the first cushion part is applied with a first pressure in a third direction intersecting the first direction and the second direction,
the second connection surface is positioned more adjacent to the upper plate than the lower surface of the first cushion part in case that the second cushion part is applied with the first pressure in the third direction, and
the first pressure is about 1 MPa or less.

14. The display device of claim 1, wherein the support member further comprises a cover film disposed between the upper plate and the lower plate.

15. The display device of claim 1, wherein the first vertical part, the gap, and the second vertical part overlap the folding region in a plan view.

16. A display device comprising:
a display panel including a first non-folding region, a folding region, and a second non-folding region which are sequentially defined in a first direction; and
a support member disposed below the display panel, the support member including:
an upper plate including openings formed therein and overlapping the folding region in a plan view; and
a lower plate disposed below the upper plate and including a first lower plate and a second lower plate spaced apart from the first lower plate by a gap,
wherein:
the first lower plate includes:
a first horizontal part parallel to the display panel; and
a first vertical part extended from the first horizontal part and bent in a second direction away from the display panel; and
the second lower plate includes:
a second horizontal part parallel to the display panel; and
a second vertical part extended from the second horizontal part and bent in the second direction away from the display panel,
wherein the first vertical part and the second vertical part overlap the folding region in a plan view, and
wherein the first vertical part comprises a first inner surface adjacent to the first cushion part, and a first outer surface spaced apart from the first cushion part;
the second vertical part comprises a second inner surface adjacent to the second cushion part, and a second outer surface spaced apart from the second cushion part; and
the first vertical part is spaced apart from the second vertical part by the gap.

17. The display device of claim 16, wherein:
the first vertical part comprises a first round part bent with a first radius of curvature;
the second vertical part comprises a second round part bent with a second radius of curvature, and
each the first radius of curvature and the second radius of curvature is about 1 mm or less.

18. The display device of claim 16, wherein the lower plate includes a copper alloy.

19. The display device of claim 16, wherein:
the upper plate comprises:
a plate folding region overlapping the folding region in a plan view; and
a first plate non-folding region and a second plate non-folding region respectively overlapping the first non-folding region and the second non-folding region in a plan view; and
openings are formed in the plate folding region.

20. The display device of claim 16, further comprising:
a cushion layer disposed below the support member, wherein the cushion layer includes:
a first cushion part including a first portion overlapping the first vertical part in a cross-sectional view; and
a second cushion part including a second portion overlapping the second vertical part in a cross-sectional view.

21. The display device of claim 20, wherein:
the first vertical part is positioned more adjacent to the upper plate than a lower surface of the first cushion part in case that the first cushion part is applied with a first pressure in a direction perpendicular to the plane,
the second vertical part is positioned more adjacent to the upper plate than a lower surface of the second cushion part in case that the second cushion part is applied with the first pressure in a direction perpendicular to the plane, and
the first pressure is about 1 MPa or less.

* * * * *